(12) United States Patent
Lee et al.

(10) Patent No.: US 7,663,398 B1
(45) Date of Patent: Feb. 16, 2010

(54) CIRCUIT AND METHOD FOR HIGH IMPEDANCE INPUT/OUTPUT TERMINATION IN SHUT OFF MODE AND FOR NEGATIVE SIGNAL SWING

(75) Inventors: Jaeseo Lee, San Jose, CA (US); Gin S. Yee, Mountain View, CA (US); Ming-Ju E. Lee, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 12/273,368

(22) Filed: Nov. 18, 2008

(51) Int. Cl.
*H03K 17/16* (2006.01)
*H03K 19/003* (2006.01)

(52) U.S. Cl. .............................. 326/30; 326/33; 326/34; 326/37

(58) Field of Classification Search .................... 326/30, 326/32–34
See application file for complete search history.

(56) References Cited

U.S. PATENT DOCUMENTS

2004/0095159 A1\* 5/2004 Kimura ........................ 326/33
2005/0001650 A1\* 1/2005 Schafer ........................ 326/30

OTHER PUBLICATIONS

PCI Express, PCI Express Base Specification Revision 1.1, Mar. 28, 2006, pp. 222-230.
PCI Express, PCI Express Base Specification Revision 2.0, Dec. 7, 2006, pp. 265-268 & 275.

\* cited by examiner

*Primary Examiner*—Anh Q Tran
(74) *Attorney, Agent, or Firm*—Vedder Price, P.C.

(57) ABSTRACT

A circuit including control logic; and configurable impedance logic, operatively coupled to the control logic, comprising a configurable transistor structure operative to selectively change from a high impedance mode where the configurable transistor structure is configurable as a plurality of series connected diodes having their cathodes coupled together, and a low impedance mode where the configurable transistor structure is configurable to include a plurality of cascoded transistors. The circuit may further include at least one control signal line from the control logic to the configurable impedance logic, where the control signal line is operative to provide a control signal for configuring the configurable impedance logic.

20 Claims, 7 Drawing Sheets

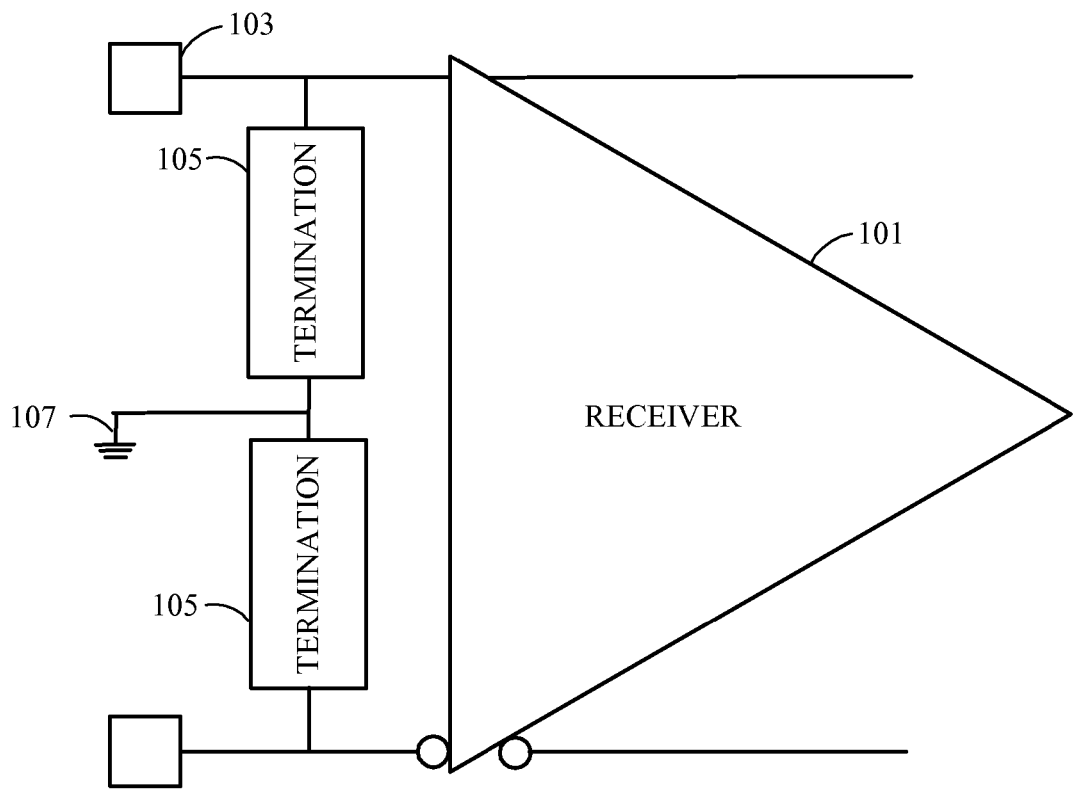
*FIG. 1*
- PRIOR ART -
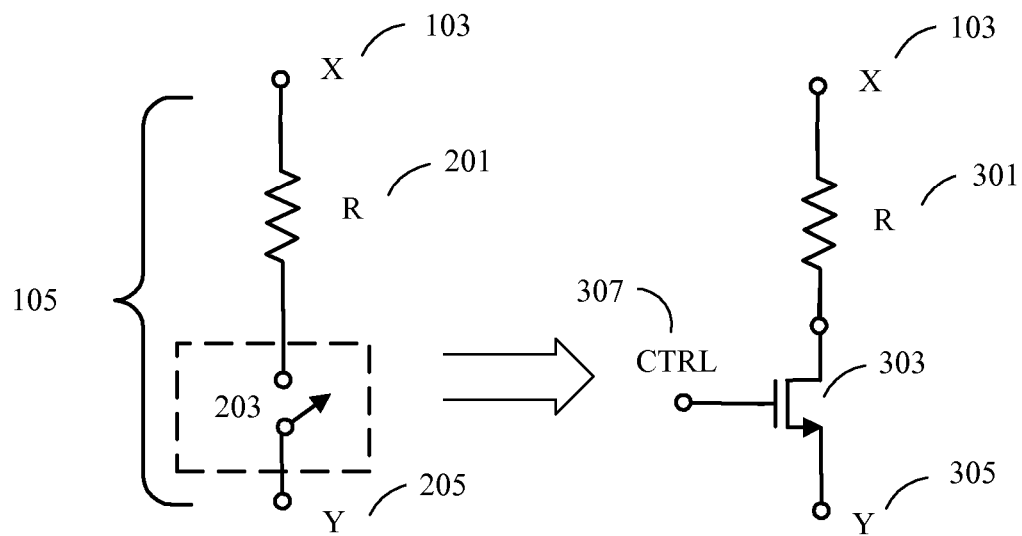
*FIG. 2*
- PRIOR ART -
*FIG. 3*
- PRIOR ART -

__US 7,663,398 B1__

CIRCUIT AND METHOD FOR HIGH IMPEDANCE INPUT/OUTPUT TERMINATION IN SHUT OFF MODE AND FOR NEGATIVE SIGNAL SWING

FIELD OF THE DISCLOSURE

The present disclosure is related to integrated circuits generally, and more specifically to Field Effect Transistor switching circuits.

BACKGROUND

Various devices related to input/output interface links require high impedance terminations in shut-off modes, which include idle modes and power down modes. An example is the PCI interconnect bus which requires a specified termination impedance between devices that are transmitting data and devices that are receiving data. For the PCI case, a transmitting device must detect the presence of a receiving device before sending data. The transmitting device therefore sends a test signal to the receiving device and monitors the corresponding receiving device impedance. A high impedance level at the receiving device side will appear as an open circuit to the transmitting device, while a low impedance will appear to the transmitting device as a closed circuit indicating that the receiving device is available to receive data.

FIG. 1 illustrates a circuit, for example a PCI circuit, having a receiver 101 connected to input terminals 103. The input terminals 103 are also connected to terminations 105 which share common ground connection 107. When a transmitting device transmits a signal to the receiver over the input terminals 103, the terminations 105 appears as either an infinite impedance, or as a predetermined resistive value such that the transmitting device determines that the receiver 101 is either unavailable (or powered down), or available and ready to receive data. FIG. 2 illustrates details of a termination circuit 105 as shown in FIG. 1. The termination circuit 105 includes terminals X 103 and Y 205, and also includes a resistor 201 and a logical switch 203. When the logical switch 203 is in an open position as shown, the impedance, or resistance, across terminals X 103 and Y 205 appears infinite. However, when the logical switch 203 is in a closed position, the impedance across terminals X 103 and Y 205 appears equal to the resistor value of resistor 201.

FIG. 3 illustrates one way of implementing the termination circuit 105 illustrated in FIG. 2. The logical switch 203 is, in FIG. 3, implemented using an n-channel Field Effect Transistor (FET) 303. The FET 303 also includes a control signal at its gate terminal, control signal 307. If, for example, the terminal Y 305 is connected to ground, then the FET 303 gate-to-source voltage ($V_{gs}$) determines whether current flows from terminal X 103 to terminal Y 305 through the FET 303 source and drain terminals. If a positive voltage is applied to terminal X 103, while the gate terminal of FET 303 (control signal 307) is connected to ground, then the voltage $V_{gs}$ is also equal to zero and therefore no current flows through the FET 303.

Thus the gate-to-source voltage of the FET 303 determines whether current flows through the FET 303. For example, as is understood by those of ordinary skill, when $V_{gs}$ higher than a threshold voltage, the FET 303 may be considered "on" and current will flow between the source and drain terminals. However when the voltage $V_{gs}$ is less than the threshold, the FET 303 will be effectively turned "off." For most implementations it is desired to have the voltage $V_{gs}$ equal to zero, or as close to zero as possible, in order to avoid potential leakage currents due to processes such as CMOS processes.

If the voltage across the terminals is reversed in polarity, that is, if the voltage applied at terminal X 103 is less than ground, while the CTRL signal 307 and terminal Y 305 are both tied to ground, then the FET 303 gate-to-source voltage $V_{gs}$ cannot be guaranteed to be equal to zero. Therefore voltage swing levels may cause undesirable current flow, which lowers the impendance and thereby causes the device state to be incorrectly perceived as a "receiver on" state by a transmitting device.

In addition, as the process technologies used to fabricate integrated circuits shrinks it becomes more difficult to achieve high impedances because of the higher leakage current induced by lower threshold voltages and shorter channel lengths.

Therefore what is needed is a circuit and method for achieving desired high impedances for positive and negative input voltage swings that still achieves a desired impedance with the process technology utilized, in light of the process technology scaling trend.

BRIEF DESCRIPTION OF THE DRAWINGS

FIG. 1 illustrates a receiver having termination circuits, wherein the receiver may receive an input signal from a transmitting device, wherein the transmitting device detects the impedance of the termination circuits in order to determine whether the receiver is powered off or is ready to receive data from the transmitting device.

FIG. 2 is an example of a termination circuit having a resistor and a logical switch, connected is series, for providing either an infinite impedance or an impedance equal to the resistive value of the resistor.

FIG. 3 is an example implementation of the termination circuit shown in FIG. 2 wherein the logical switch is realized using a FET.

DETAILED DESCRIPTION

Figure 4:
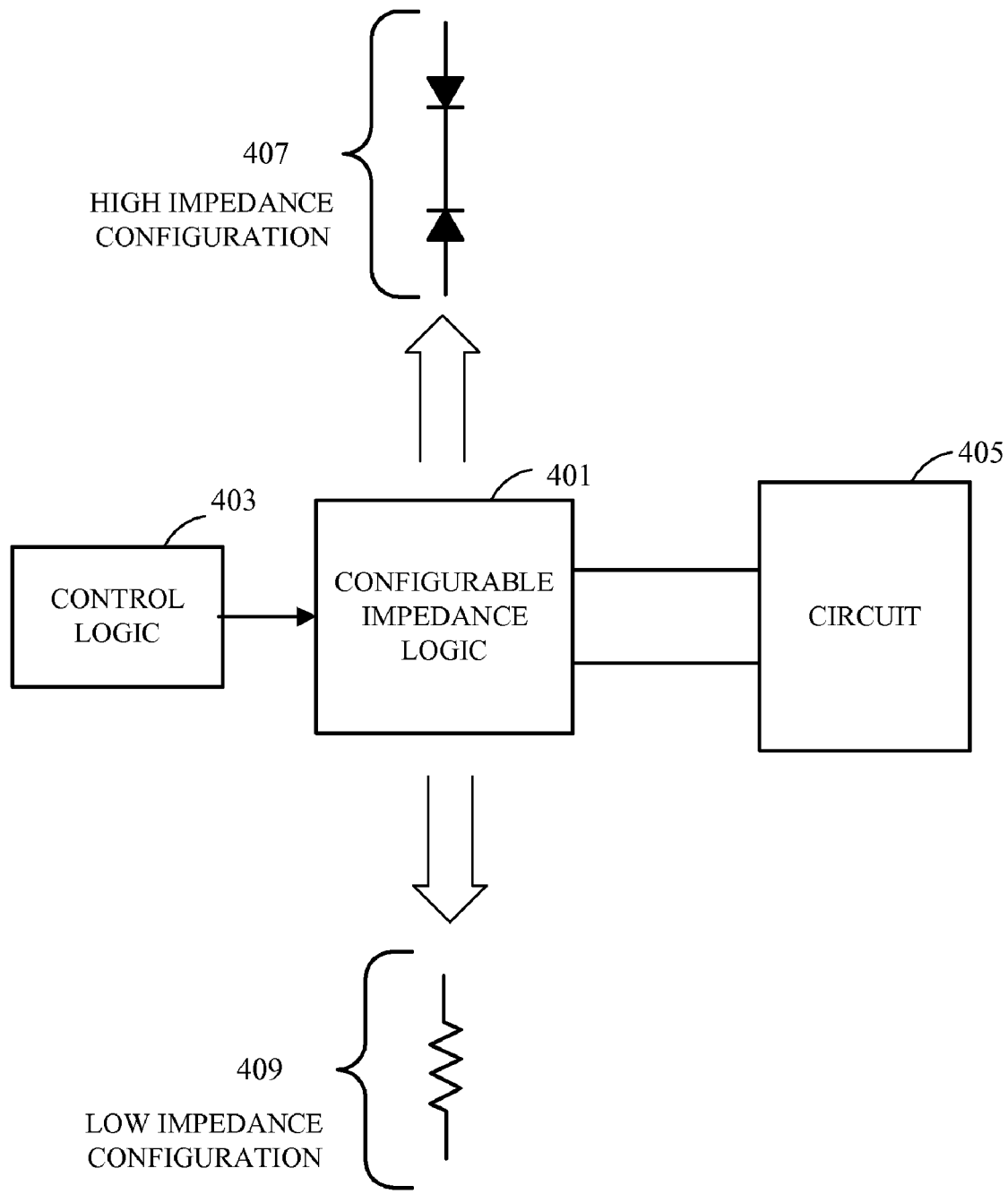
FIG. 4 is a block diagram of a configurable impedance logic and control logic in accordance with the various embodiments.

The embodiments disclosed herein provide a circuit including control logic; and configurable impedance logic, operatively coupled to the control logic, comprising a configurable transistor structure operative to selectively change from a high impedance mode where the configurable transistor structure is configurable as a plurality of series connected diodes having their cathodes coupled together, and a low impedance mode where the configurable transistor structure is configurable to include a plurality of cascoded transistors.

The circuit may further include at least one control signal line from the control logic to the configurable impedance logic, where the control signal line is operative to provide a control signal for configuring the configurable impedance logic.

Another embodiment provides a termination circuit which includes a resistive element having a resistive element first terminal and a resistive element second terminal, with the resistive element first terminal connected to an input termination circuit terminal; a first field effect transistor (FET) having a first FET first current terminal, a first FET second current terminal and a first FET gate terminal, with the first FET first current terminal connected to the resistive element second terminal; a first logical switch having a first logical switch first terminal and a first logical switch second terminal, with the first logical switch first terminal connected to the first FET first current terminal and the resistive element second terminal; a second logical switch having a second logical switch first terminal and a second logical switch second terminal, with the second logical switch first terminal to receive a supply voltage and the second logical switch second terminal connected to the first logical switch second terminal and to the first FET gate terminal; a second FET having a second FET first current terminal, a second FET second current terminal and a second FET gate terminal, with the second FET first current terminal connected to the first FET second current terminal, the second FET second current terminal connected to a second input termination circuit terminal; a third logical switch having a third logical switch first terminal and a third logical switch second terminal, with the third logical switch first terminal to receive the supply voltage and the third logical switch second terminal connected to the second FET gate terminal; and a fourth logical switch having a fourth logical switch first terminal and a fourth logical switch second terminal, with the fourth logical switch first terminal connected to second FET second current terminal and the fourth logical switch second terminal connected to the second FET gate terminal and the third logical switch second terminal.

Also disclosed is an integrated circuit including an input termination circuit which includes a resistive element having a resistive element first terminal and a resistive element second terminal, with the resistive element first terminal connected to an input terminal; a first field effect transistor (FET) having a first FET first current terminal, a first FET second current terminal and a first FET gate terminal, with the first FET first current terminal connected to the resistive element second terminal; a second field effect transistor (FET) having a second FET first current terminal, a second FET second current terminal and a second FET gate terminal, with the second FET first current terminal connected to the first FET second current terminal, the second FET second current terminal connected to ground; a third field effect transistor (FET) having a third FET first current terminal, a third FET second current terminal and a third FET gate terminal, with the third FET first current terminal connected to the first FET first current terminal and to the resistive element second terminal, the third FET second current terminal connected to the first FET gate terminal; a fourth field effect transistor (FET), which may be a p-channel FET, having a fourth FET first current terminal, a fourth FET second current terminal and a fourth FET gate terminal, with the fourth FET first current terminal to receive a supply voltage. the fourth FET second current terminal connected to the third FET second current terminal and to the first FET gate terminal; and an inverter logic having an inverter logic input terminal and an inverter logic output terminal, with the inverter logic input terminal connected to the third FET gate terminal and to the fourth FET gate terminal, with the inverter logic output terminal connected to the second FET gate terminal.

Also disclosed is a method of fabricating an input termination circuit on an integrated circuit that includes providing a resistive element having a resistive element first terminal and a resistive element second terminal, with the resistive element first terminal connected to an input terminal; providing a first FET having a first FET first current terminal, a first FET second current terminal and a first FET gate terminal, with the first FET first current terminal connected to the resistive element second terminal; providing a second FET having a second FET first current terminal, a second FET second current terminal and a second FET gate terminal, with the second FET first current terminal connected to said first FET second current terminal, with the second FET second current terminal connected to ground; providing a third FET having a third FET first current terminal, a third FET second current terminal and a third FET gate terminal, with the third FET first current terminal connected to the first FET first current terminal and to the resistive element second terminal, the third FET second current terminal connected to the first FET gate terminal; providing a fourth FET, which may be a p-channel FET, having a fourth FET first current terminal, a fourth FET second current terminal and a fourth FET gate terminal, with the fourth FET first current terminal to receive a supply voltage, the fourth FET second current terminal connected to the third FET second current terminal and to the first FET gate terminal; and providing an inverter logic having an inverter logic input terminal and an inverter logic output terminal, where the inverter logic input terminal connected to the third FET gate terminal and to the fourth FET gate terminal. with the inverter logic output terminal connected to the second FET gate terminal.

The embodiments also include a computer readable memory including executable instructions for execution by at least one processor, that when executed cause an integrated circuit fabrication system to provide a resistive element having a resistive element first terminal and a resistive element second terminal, with the resistive element first terminal connected to an input terminal; provide a first FET having a first FET first current terminal, a first FET second current terminal and a first FET gate terminal, the first FET first current terminal connected to the resistive element second terminal; provide a second FET having a second FET first current terminal, a second FET second current terminal and a second FET gate terminal, the second FET first current terminal connected to the first FET second current terminal, the second FET second current terminal connected to ground; provide a third FET having a third FET first current terminal, a third FET second current terminal and a third FET gate terminal, the third FET first current terminal connected to the first FET first current terminal and to the resistive element second terminal, the third FET second current terminal connected to the first FET gate terminal; provide a fourth FET, which may be a p-channel FET, having a fourth FET first current terminal, a fourth FET second current terminal and a fourth FET gate terminal, the fourth FET first current terminal to receive a supply voltage, the fourth FET second current terminal connected to the third FET second current terminal and to the first FET gate terminal; and provide an inverter logic having an inverter logic input terminal and an inverter logic output terminal, with the inverter logic input terminal connected to the third FET gate terminal and to the fourth FET gate terminal, the inverter logic output terminal connected to the second FET gate terminal.

Turning now to the drawings, FIG. 4 illustrates a configurable impedance logic 401 in accordance with the embodiments. The configurable impedance logic 401 is connected to a circuit 405 and receives a control signal from a control logic 403. In accordance with the embodiments, the configurable impedance logic 401, is operatively coupled to the control logic 403, and comprises a configurable transistor structure which is operative to selectively change from a high impedance mode to a low impedance mode. In the high impedance mode a configurable transistor structure is configurable as a set of series connected diodes, for example, two diodes having their cathodes coupled together. In a low impedance mode the configurable impedance logic 401 has a configurable transistor structure that is configured to appear as a set of cascoded transistors. The control logic 403 provides a control signal to the configurable impedance logic 401, and is operative to configure the impedance logic 401 into the high impedance or low impedance mode as discussed above.

Figure 5:
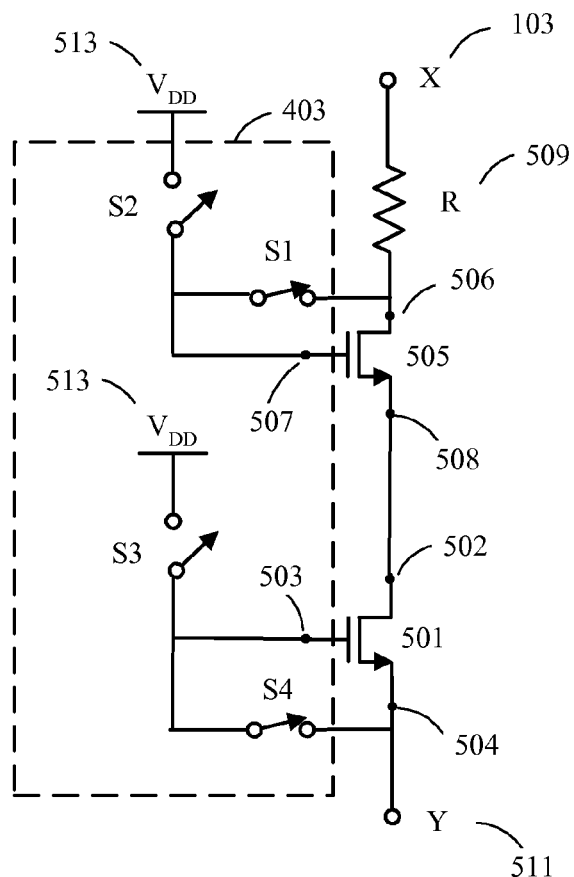
FIG. 5 is a schematic diagram showing further details of the configurable impedance logic 401 and control logic 403 illustrated by FIG. 4, wherein the impedance logic is configured for the high impedance case.
Figure 6:
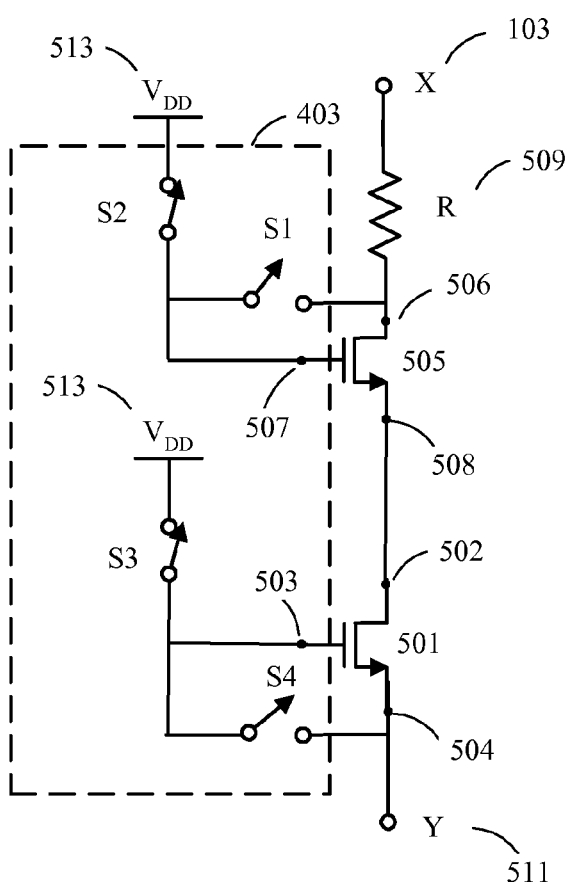
FIG. 6 is a schematic diagram showing further details of the configurable impedance logic 401 and control logic 403 illustrated by FIG. 4, wherein the impedance logic is configured for the low impedance case, that is, for normal operation.

FIGS. 5 and 6 illustrate further details of the configurable impedance logic 401 in accordance with the embodiments. In FIG. 5 the configurable impedance logic is shown configured in high impedance mode. For example, switch S1 and switch S4 are in a closed position, while switch S2 and switch S3 are in an open position. The logical switches S1, S2, S3 and S4, implement the control logic 403 illustrated in FIG. 4. The FET 505 and FET 501, and also the resistor 509, connected across terminal X 103 and Y 511, implement the configurable impedance logic 401 illustrated in FIG. 4.

The FET 505 is shown having its "drain" terminal 506 connected to the resistor 509 and logical switch S1, and its "source" terminal 508 connected to the "drain" terminal 502 of FET 501. The FET 501 is shown having its source terminal 504 connected to terminal Y 511 and to logical switch S4. However, the source terminal of the FETs may act as a drain, and the drain as a source, when the voltage polarity applied across the FETs is reversed. Therefore, for simplicity, the source and drain terminals of the FETs may be referred to collectively herein as "current terminals."

For example, if the voltage across the X 103 and Y 511 terminals ($V_{XY}$) is less than zero, that is, the voltage at terminal X 103 is a negative polarity with respect to terminal Y 511, then the FET 505 current terminal 506 acts as a source terminal, and $V_{gs}$ for FET 505 will be equal to zero and no current will flow through the FET 505. Therefore the FET 505 may be considered as being configured as a diode connected FET, which will appear as a reverse biased diode. The FET current terminal 506 is thus acting as the diode anode terminal, connected to the resistor 509, and the FET current terminal 508 is thus acting as the diode cathode terminal connected to FET 501 current terminal 502.

The FET 501 may be considered as a forward biased diode in this case, and will allow current to flow through the FET 501, since the voltage at the FET 501 gate terminal 503 will be equal to the voltage applied at terminal Y 511. Thus the FET 501 may considered to be configured as a diode having its anode (current terminal 504) connected to terminal Y 511 (and logical switch S4), and its cathode (current terminal 502) connected to the diode connected FET 505 cathode (current terminal 508). Current flow will be therefore be blocked however, by the FET 505, which, as discussed above, acts as a reversed biased diode with respect to the voltage polarity applied at terminal X 103 with respect to terminal Y 511.

Therefore for the case where the polarity between X 103 and Y 511 is negative, that is, when the voltage at to terminal X 103 is less than the voltage at terminal Y 511, the FET 505 will appear as a reversed biased diode and will not allow current to flow between the terminals. However, if the voltage $V_{xy}$ is greater than zero, then the gate to source voltage $V_{gs}$ of FET 501 will be equal to zero (since the FET 501 gate terminal 503 is connected to terminal Y 511 through closed logical switch S4) and thus no current will flow through FET 501. In other words, for the case where the voltage at terminal X 103 is positive with respect to terminal Y 511, the FET 501 will appear as a reverse biased diode having its anode (current terminal 504) connected to terminal Y 511, and its cathode (current terminal 502) connected to FET 505 current terminal 508.

Therefore the configurable impedance logic circuit 401, for the logical switch configuration shown in FIG. 5, is configured as diodes 407 in FIG. 4, that is, two diodes connected in series with their anodes connected to either terminal X or Y and their cathodes connected together. In the example provided in FIG. 5, FET 505 current terminal 508 appears as a cathode terminal for cases where the polarity of voltage at terminal X 103 is negative, while FET 501 current terminal 502 appears as a cathode terminal for cases where the polarity of voltage at terminal X 103 is positive. Therefore, for any polarity voltage across terminals X and Y, at least one of the FETs, either FET 505 or FET 501, is configured as a reverse biased diode with respect to the current flow.

Therefore either FET 505 or FET 501 creates a large impedance value, equal to the impedance of one of the reverse biased diode connected FETs, that may appear as an infinite impedance across terminals X and Y thereby emulating an open logical switch similar to the logical switch 203 illustrated by FIG. 2. However, unlike the circuits illustrated in FIG. 2 and FIG. 3 the configurable impedance logic of the various embodiments, and as illustrated in FIGS. 5 and 6, is useful for any polarity of voltage across the terminals X and Y as will be discussed further herein.

FIG. 6 illustrates the case for normal operation, that is, the configurable impedance logic is configured to have a low impedance equal to approximately the value of resistor 509. Therefore, in FIG. 6, logical switch S1 and logical switch S4 are in an open position while logical switch S2 and logical switch S3 are in a closed position. Therefore the system supply voltage, voltage $V_{DD}$ 513, is applied to the gate terminal 507 of FET 505 and also to the gate terminal 503 of FET 501. Therefore FET 505 and FET 501 will be in an "on" state, and current will be allowed to flow from terminal X to terminal Y regardless of the polarity. The resistance across the terminals X 103 and Y 511 will therefore appear to the transmitting device to be approximately the value of the resistor 509.

Figure 7:
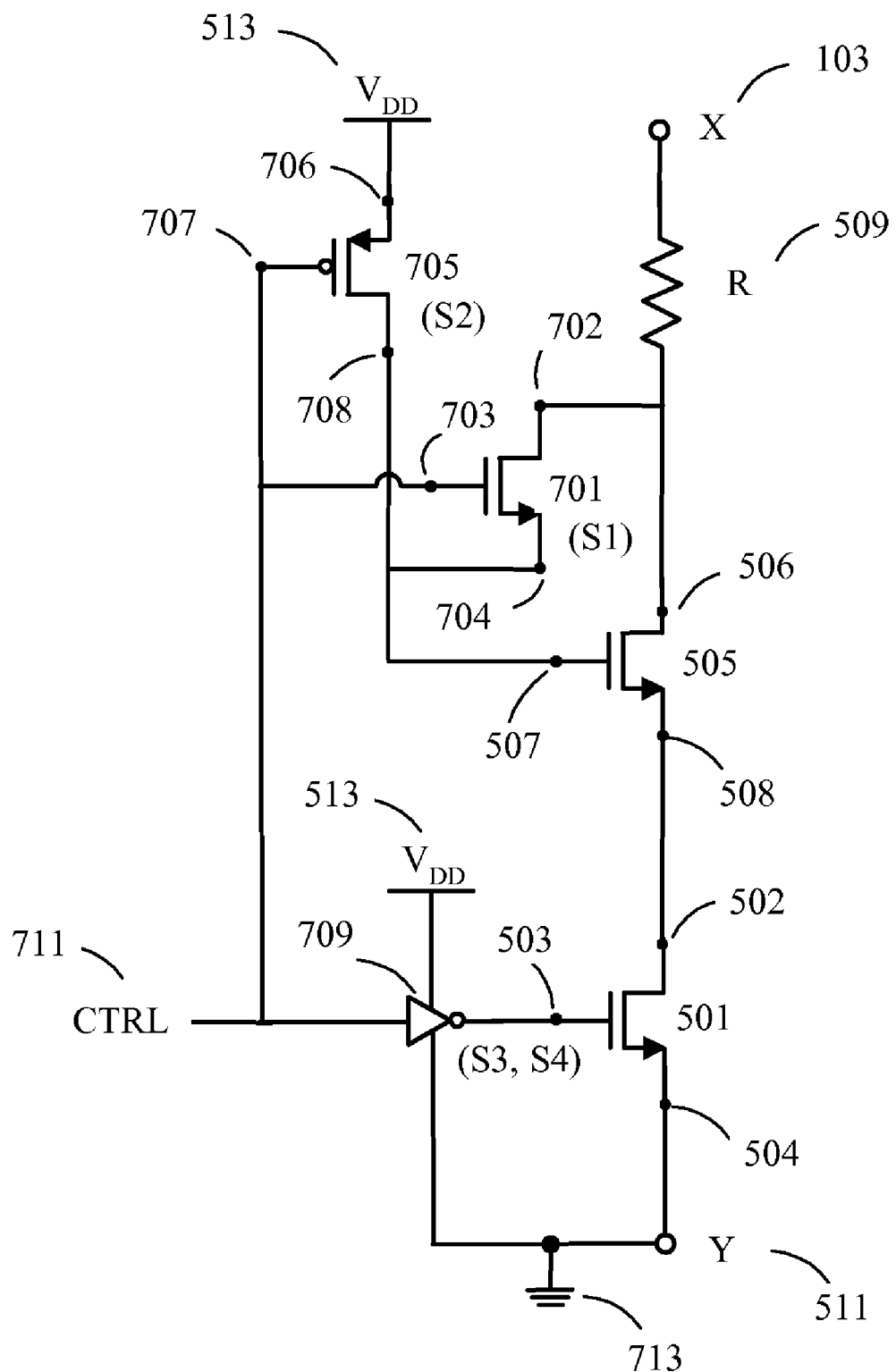
FIG. 7 is a schematic diagram illustrating an alternative embodiment for the configurable impedance logic and control logic illustrated in FIG. 4, wherein the logical switches are realized using an n-type FET, a p-type FET and an inverter.

FIG. 7 illustrates an alternative embodiment for the configurable impedance logic and control logic as illustrated by FIG. 4. In FIG. 7 the configurable impedance logic includes the resistor 509, the FET 505 which is series connected to the FET 501 which is further connected to terminal Y. For the example embodiment illustrated in FIG. 7, the FET 501 current terminal 504 is shown connected to ground 713 via terminal Y 511. The logical switch S1 is realized using the FET 701. FET 701 has a first current terminal 702 connected to the resistor 509 and to the current terminal 506 of FET 505. The logical switch S2 is realized by FET 705 which in some embodiments may be a p-type FET.

As discussed previously, the source and drain terminals of the various FETs illustrated in the FIGs. are referred to herein as current terminals. The term current terminals is used because the drain and source function of the FETs is relative to the applied polarity voltage. Therefore as discussed briefly with respect to FIG. 5 and FIG. 6, either one of FET 505 or FET 501 may, depending on the polarity applied across terminals X and Y, appear as a diode connected FET. The appropriate diode connected FET will effectively operate as a reverse biased diode, for the various embodiments, depending likewise on the voltage polarity applied. Thus in FIG. 7 the source voltage $V_{DD}$ 513 is connected to a current terminal 706 of the p-type FET 705 wherein FET 705 realizes logical switch S2.

The second current terminal 708 of FET 705 is connected to a current terminal 704 of FET 701 and to the gate terminal 507 of FET 505. A resistor 509 is connected to the X terminal 103, to the current terminal 702 of FET 701, and to the current terminal 506 of FET 505. The gate terminal 707 of p-type FET 705 is connected to the gate terminal 703 of FET 701 and also to an inverter 709. The inverter 709 receives a control signal 711 and realizes the logical switches S3 and S4. The output of inverter 709 is connected to the gate terminal 503 of FET 501. FET 501 has a current terminal 502 connected to the current terminal 508 of FET 505 and has its second current terminal 504 connected to terminal Y 511 which is connected to ground 713 as was discussed previously.

Figure 8:
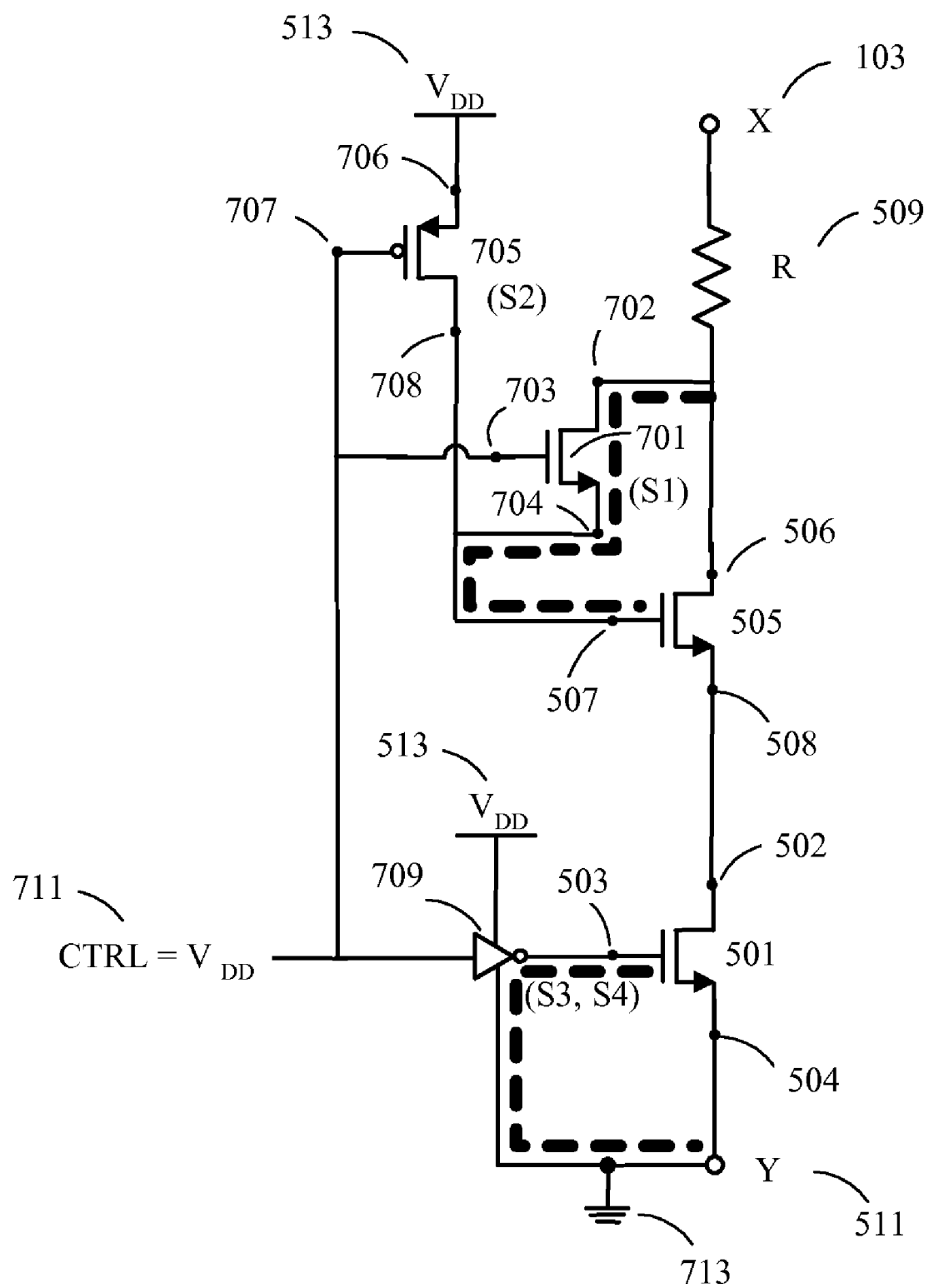
FIG. 8 is a schematic diagram illustrating high impedance operation of the embodiment illustrated by FIG. 7.

FIG. 8 illustrates operation of the circuit embodiment illustrated in FIG. 7 for the high impedance case. For the high impedance case illustrated in FIG. 8 the control voltage 711 is equal to the system supply voltage $V_{DD}$ 513. As was discussed previously, depending on the polarity of the voltage applied between terminal X 103 and terminal Y 511, one of the FETs, either FET 505 or FET 501, will be configured to be a reverse biased diode. In other words, both FET 505 and FET 501 will be configured as a diode connected FET, but one of them will be in a reverse biased condition with respect to the voltage of a given polarity. Therefore for the embodiment illustrated in FIG. 8, if, for example, a positive voltage is applied to terminal X 103, then current will not be able to flow from terminal X 103 to Y 511 because FET 501 will appear as a reverse biased diode with respect to the voltage at terminal X 103. That is, the voltage at the gate of FET 501 will be equal to the inverted value of $V_{DD}$ such that FET 501 $V_{gs}$ is equal to zero. For the case where a negative polarity voltage is applied to terminal X 103, the FET 505 will appear as the reverse biased diode (due to its configuration as a diode connected FET) and therefore block current flow between terminal X and Y.

Figure 9:
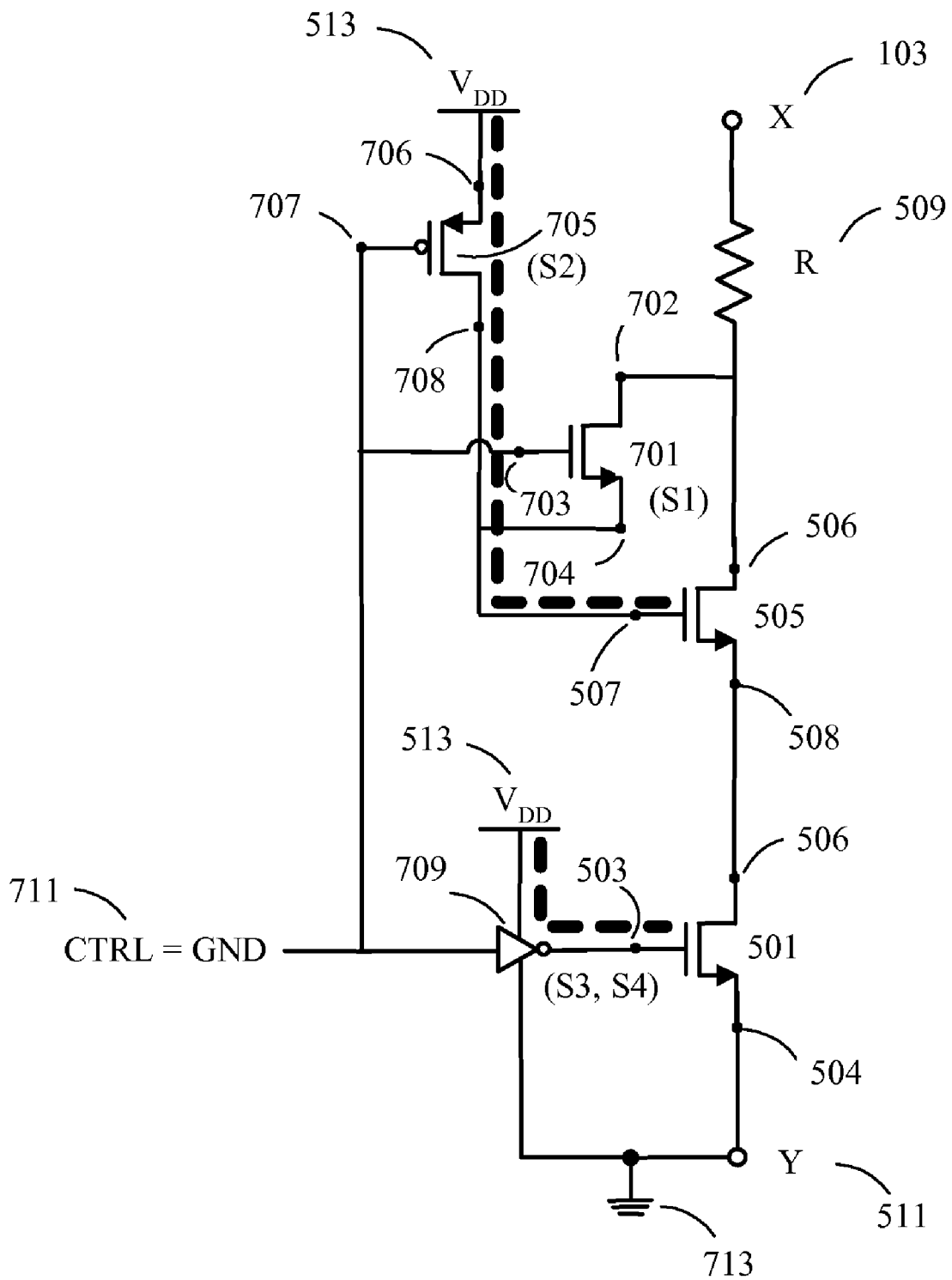
FIG. 9 is a schematic diagram illustrating normal operation or low impedance operation of the embodiment illustrated in FIG. 7.

FIG. 9 illustrates the embodiment as shown in FIG. 7 and FIG. 8 for the case where normal operation is desired, that is, where a minimum impedance value approximately equal to resistor 509 is desired between terminal X and terminal Y. For the scenario illustrated in FIG. 9, the control voltage 711 is set to ground such that the signal through inverter 709, which appears at the gate terminal 503 of FET 501, is equal to the voltage $V_{DD}$ 513.

Likewise with the control voltage 711 set to ground appears at the FET 705 gate terminal 707, and therefore FET 705 appears as a closed logical switch. At this time, FET 701 appears as an open logical switch. Therefore the gate-to-source voltage $V_{gs}$ for both FET 505 and 501 are higher than the threshold voltage such that both FET 505 and FET 501 are in an "on" state, and current may flow between terminal X and terminal Y. Therefore the impedance, apparent to a transmitting device, across terminal X and terminal Y, is equal to approximately the value of the resistor 509.

The configuration of the configurable impedance logic, and its corresponding control logic, is advantageous in that the configurable impedance logic is able to achieve a high impedance. For example, in some embodiments, a high impedance may be equal to, or greater than, approximately 50 K ohms, and may be achieved even for negative voltage swings across the X and Y terminals. Further, in other embodiments, a high impedance may be in a range of approximately 100 to 300 K ohms or more, and may also be achieved for negative voltage swings across the X and Y terminals. Additionally, some embodiments may provide a high impedance for voltage swings of approximately plus and minus 200 millivolts. For example, some embodiments may provide a high impedance for a voltage range of plus 200 millivolts to minus 150 millivolts. Simulation results have shown that, for the embodiments herein disclosed, the beneficial impedance results may be achieved for various CMOS processes including sub-micrometer technology. For example, the various advantages obtained by the various embodiments may be achieved for 45 nanometer processes among other process scaling. For example, the advantages of the various embodiments may be achieved for other process scaling such as 32 to 65 nanometer processes. Therefore, in accordance with the embodiments, the circuit disclosed herein may be used with normal channel lengths associated with CMOS process scaling without the need to increase the channel lengths in order to reduce leakage currents. Normal minimum channel length enables smaller device width which, in turn, reduces overall parasitic capacitance which is beneficial for high speed applications. Additional advantages include that the transmitting device sending a test signal to a receiving device utilizing a termination circuit having the structure as described herein need not provide any special sensing equipment to sense variations in the impedance that are lower than some specified values, for example, as specified by versions of the PCI specifications as 200 K ohms. Various other advantages will be apparent to those of ordinary skill.

Figure 10:
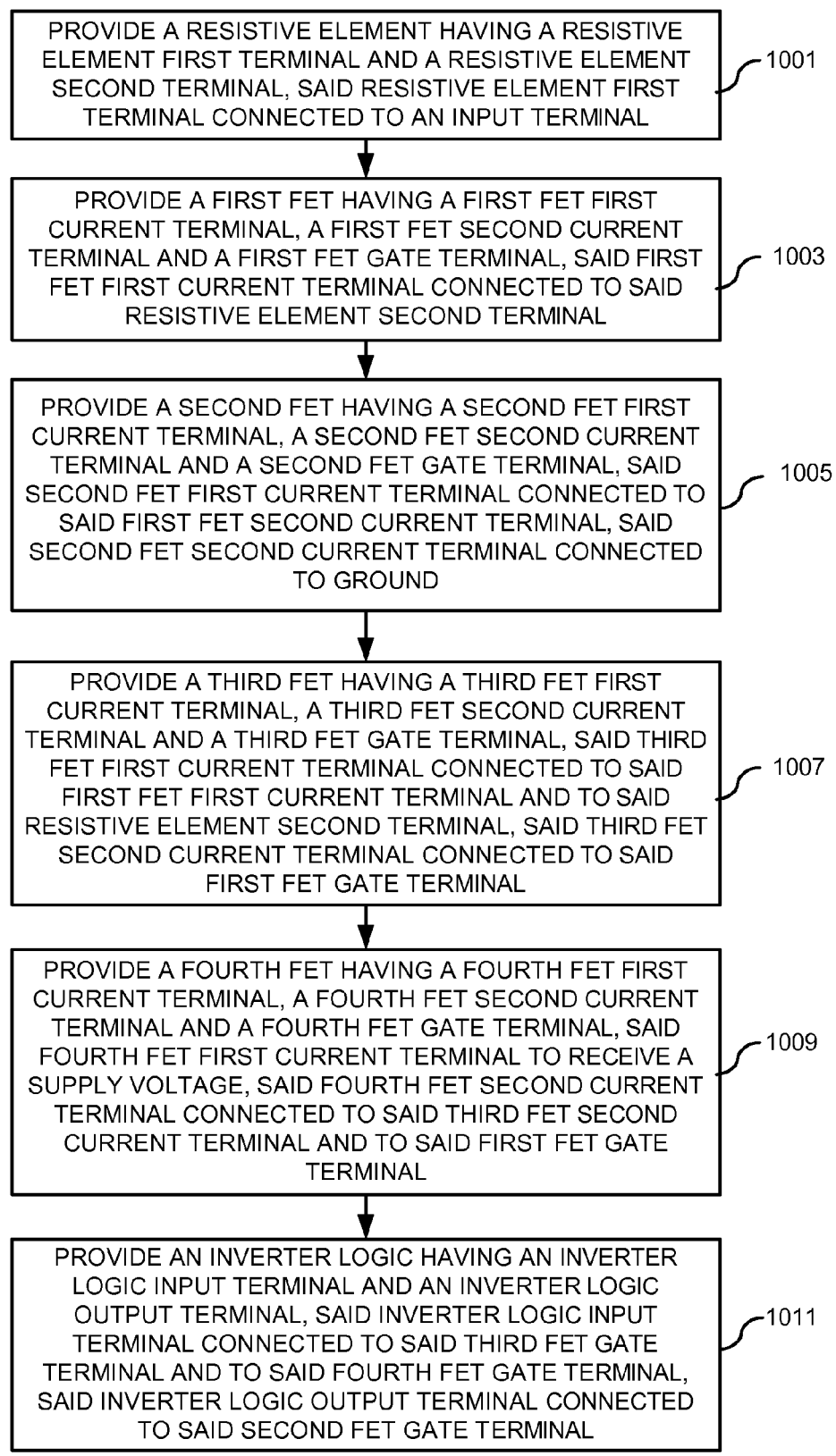
FIG. 10 is a flow chart illustrating a method of fabrication of a configurable impedance logic and control logic in accordance with the embodiments.

FIG. 10 is a flow chart illustrating a method of fabricating a configurable impedance logic and control logic in accordance with the embodiments. Thus in 1001 a resistive element is provided having a resistive element first terminal and a resistive element second terminal where the resistive element first terminal is connected to an input terminal of a transmitting or receiving device. As shown in 1003 a first FET is provided having a first FET current terminal, a first FET second current terminal, and a first FET gate terminal, where the first current terminal is connected to the resistive element's second terminal. In 1005, a second FET is provided having a second FET first current terminal, a second FET second current terminal, and a second FET gate terminal. The second FET first current terminal is connected to the first FET second current terminal, where the second FET second current terminal is connected to ground. In 1007, a third FET is provided having a third FET first current terminal, a third FET second current terminal and a third FET gate terminal. The third FET first current terminal is connected to the first FET first current terminal and to the resistive element second current terminal. The third FET second current terminal is connected to the first FET gate terminal. In 1009, a fourth FET is provided having a fourth FET first current terminal, a fourth FET second current terminal and fourth FET gate terminal. The fourth FET first current terminal is for receiving a supply voltage and the fourth FET second current terminal is connected to the third FET second current terminal and to the first FET gate terminal. In 1011, an inverter logic is provided having an inverter logic input terminal and an inverter logic output terminal. The inverter logic input terminal is connected to the third FET gate terminal and to the fourth FET gate terminal. The inverter logic output terminal is connected to the second FET gate terminal. The method illustrated in FIG. 10 may be implemented in a Hardware Description Language (HDL) code or via a Netlist as would be understood by one of ordinary skill. Such HDL code or Netlist may be stored on a computer readable medium such as, but not limited to, a CD, DVD, or other non-volatile memory that may provide code to be executed by one or more processors.

The various embodiments disclosed herein may utilize n-type FETs, or, in some embodiments, may use p-type FETs and would remain in accordance with the various embodiments herein disclosed. In other words, various embodiments may utilize varied components for implementation of the logical switches comprising the control logic as illustrated in FIG. 4. Likewise various components may be utilized in various embodiments for the configurable impedance logic as was also described with respect to FIG. 4 as well as the other Figures. Therefore various equivalents of the embodiments described in detail herein are contemplated in accordance with the disclosure provided herein. Therefore, other variations that would be equivalent to the herein disclosed embodiments may occur to those of ordinary skill in the art and would remain in accordance with the spirit and scope of the embodiments as defined herein by the following claims:

What is claimed is:

1. A circuit comprising:
    control logic; and
    configurable impedance logic, operatively coupled to the control logic, comprising a configurable transistor structure operative to selectively change from a high impedance mode where the configurable transistor structure is configurable as a plurality of series connected diodes having their cathodes coupled together, and a low impedance mode where the configurable transistor structure is configurable to comprise a plurality of cascoded transistors.

2. The circuit of claim 1, further comprising:
    at least one control signal line from said control logic to said configurable impedance logic, said control signal line operative to provide a control signal for configuring said configurable impedance logic.

3. The circuit of claim 1, wherein said configurable impedance logic comprises:
    a first field effect transistor (FET) having a first FET first current terminal, a first FET second current terminal and a first FET gate terminal, said first FET first current terminal for operatively coupling to an input signal source; and
    a second field effect transistor (FET) having a second FET first current terminal, a second FET second current terminal and a second FET gate terminal, said second FET first current terminal connected to said first FET second current terminal to form a current path, said second FET second current terminal connected to a ground connection; and
wherein said control logic comprises:
    a switching logic operatively coupled to said first FET first current terminal, said first FET gate terminal, said second FET second current terminal and said second FET gate terminal, said switching logic being operative to:
        cause, in response to a control signal, one of said first FET or said second FET to form a reverse-biased diode connected FET for an input signal having a positive polarity with respect to ground, and cause the other of said first FET or said second FET to form a reverse-biased diode connected FET for an input signal having a negative polarity with respect to ground.

4. The circuit of claim 3, wherein an impedance of said configurable impedance logic from said first FET first current terminal to said second FET second current terminal is about 200 k-ohm when presented with an input signal voltage between approximately positive 200 millivolts to negative 200 millivolts by said input signal source.

5. The circuit of claim 1, wherein said impedance logic is constructed using at least one field effect transistor (FET) having a channel length between approximately 32 to 65 nanometers.

6. A termination circuit comprising:
    a resistive element having a resistive element first terminal and a resistive element second terminal, said resistive element first terminal connected to a first termination circuit terminal;
    a first field effect transistor (FET) having a first FET first current terminal, a first FET second current terminal and a first FET gate terminal, said first FET first current terminal connected to said resistive element second terminal;
    a first logical switch having a first logical switch first terminal and a first logical switch second terminal, said first logical switch first terminal connected to said first FET first current terminal and said resistive element second terminal;
    a second logical switch having a second logical switch first terminal and a second logical switch second terminal, said second logical switch first terminal to receive a supply voltage and said second logical switch second terminal connected to said first logical switch second terminal and to said first FET gate terminal;
    a second field effect transistor (FET) having a second FET first current terminal, a second FET second current terminal and a second FET gate terminal, said second FET first current terminal connected to said first FET second current terminal, said second FET second current terminal connected to a second termination circuit terminal;
    a third logical switch having a third logical switch first terminal and a third logical switch second terminal, said third logical switch first terminal to receive said supply voltage and said third logical switch second terminal connected to said second FET gate terminal; and
    a fourth logical switch having a fourth logical switch first terminal and a fourth logical switch second terminal, said fourth logical switch first terminal connected to second FET second current terminal and said fourth logical switch second terminal connected to said second FET gate terminal and said third logical switch second terminal.

7. The termination circuit of claim 6, wherein said first logical switch and said second logical switch each comprise a component selected from the group of: a diode, a p-channel FET, an n-channel FET, and a bi-polar junction transistor (BJT).

8. The termination circuit of claim 6, wherein an impedance between said an input termination circuit terminal and said second input termination circuit terminal is about 200 k-ohm when presented with an input signal voltage between approximately positive 200 millivolts to negative 200 millivolts.

9. The termination circuit of claim 6, further comprising:
    an input signal receiving logic coupled to said termination circuit at said first termination circuit terminal and wherein said second termination circuit terminal is connected to ground, wherein said first logical switch and said fourth logical switch are closed, and said second logical switch and said third logical switch are open, when said input signal receiving logic is powered off.

10. The termination circuit of claim 9, wherein said first logical switch being closed connects said first FET first current terminal to said first FET gate terminal such that said first FET is diode connected.

11. The termination circuit of claim 6, further comprising:
an input signal receiving logic coupled to said termination circuit at said first termination circuit terminal and wherein said second termination circuit terminal is connected to ground, wherein said first logical switch and said fourth logical switch are open, and said second logical switch and said third logical switch are closed, when said input signal receiving logic is powered on.

12. The termination circuit of claim 6, wherein said termination circuit is a component circuit of an integrated circuit.

13. An integrated circuit including a termination circuit, the termination circuit comprising:
a resistive element having a resistive element first terminal and a resistive element second terminal, said resistive element first terminal connected to a termination circuit input terminal;
a first field effect transistor (FET) having a first FET first current terminal, a first FET second current terminal and a first FET gate terminal, said first FET first current terminal connected to said resistive element second terminal;
a second field effect transistor (FET) having a second FET first current terminal, a second FET second current terminal and a second FET gate terminal, said second FET first current terminal connected to said first FET second current terminal, said second FET second current terminal connected to ground;
a third field effect transistor (FET) having a third FET first current terminal, a third FET second current terminal and a third FET gate terminal, said third FET first current terminal connected to said first FET first current terminal and to said resistive element second terminal, said third FET second current terminal connected to said first FET gate terminal;
a fourth field effect transistor (FET) having a fourth FET first current terminal, a fourth FET second current terminal and a fourth FET gate terminal, said fourth FET first current terminal to receive a supply voltage, said fourth FET second current terminal connected to said third FET second current terminal and to said first FET gate terminal; and
an inverter logic having an inverter logic input terminal and an inverter logic output terminal, said inverter logic input terminal connected to said third FET gate terminal and to said fourth FET gate terminal, said inverter logic output terminal connected to said second FET gate terminal.

14. The integrated circuit of claim 13, wherein said first FET, said second FET and said third FET are n-channel FETs and wherein said fourth FET is a p-channel FET having an inverter at said fourth FET gate terminal.

15. The integrated circuit of claim 13, further comprising:
an input signal receiving logic coupled to said termination circuit at termination circuit input terminal and wherein a second termination circuit terminal is connected to ground, wherein said first logical switch and said fourth logical switch are closed, and said second logical switch and said third logical switch are open, when said input signal receiving logic is powered off.

16. An electronic device comprising the integrated circuit of claim 15, wherein the electronic device further comprises:
an input signal transmitting logic coupled to said input signal receiving logic via said termination circuit.

17. The integrated circuit of claim 13, wherein said first FET, said second FET, said third FET and said fourth FET each have a channel length of substantially 45 nanometers or less.

18. A method of fabricating a termination circuit on an integrated circuit comprising:
providing a resistive element having a resistive element first terminal and a resistive element second terminal, said resistive element first terminal connected to an input terminal;
providing a first FET having a first FET first current terminal, a first FET second current terminal and a first FET gate terminal, said first FET first current terminal connected to said resistive element second terminal;
providing a second FET having a second FET first current terminal, a second FET second current terminal and a second FET gate terminal, said second FET first current terminal connected to said first FET second current terminal, said second FET second current terminal connected to ground;
providing a third FET having a third FET first current terminal, a third FET second current terminal and a third FET gate terminal, said third FET first current terminal connected to said first FET first current terminal and to said resistive element second terminal, said third FET second current terminal connected to said first FET gate terminal;
providing a fourth FET having a fourth FET first current terminal, a fourth FET second current terminal and a fourth FET gate terminal, said fourth FET first current terminal to receive a supply voltage, said fourth FET second current terminal connected to said third FET second current terminal and to said first FET gate terminal; and
providing an inverter logic having an inverter logic input terminal and an inverter logic output terminal, said inverter logic input terminal connected to said third FET gate terminal and to said fourth FET gate terminal, said inverter logic output terminal connected to said second FET gate terminal.

19. The method of claim 18, wherein said first FET, said second FET and said third FET are n-channel FETS and wherein said fourth FET is a p-channel FET having an inverter connected at said fourth FET gate terminal.

20. A computer readable memory comprising:
executable instructions for execution by at least one processor, that when executed cause an integrated circuit fabrication system to:
provide a resistive element having a resistive element first terminal and a resistive element second terminal, said resistive element first terminal connected to an input terminal;
provide a first FET having a first FET first current terminal, a first FET second current terminal and a first FET gate terminal, said first FET first current terminal connected to said resistive element second terminal;
provide a second FET having a second FET first current terminal, a second FET second current terminal and a second FET gate terminal, said second FET first current terminal connected to said first FET second current terminal, said second FET second current terminal connected to ground;
provide a third FET having a third FET first current terminal, a third FET second current terminal and a third FET gate terminal, said third FET first current terminal connected to said first FET first current terminal and to said resistive element second terminal, said third FET second current terminal connected to said first FET gate terminal;

provide a fourth FET having a fourth FET first current terminal, a fourth FET second current terminal and a fourth FET gate terminal, said fourth FET first current terminal to receive a supply voltage, said fourth FET second current terminal connected to said third FET second current terminal and to said first FET gate terminal; and provide an inverter logic having an inverter logic input terminal and an inverter logic output terminal, said inverter logic input terminal connected to said third FET gate terminal and to said fourth FET gate terminal, said inverter logic output terminal connected to said second FET gate terminal.

* * * * *